(12) United States Patent
Cheung

(10) Patent No.: US 6,524,872 B1
(45) Date of Patent: Feb. 25, 2003

(54) USING FAST HOT-CARRIER AGING METHOD FOR MEASURING PLASMA CHARGING DAMAGE

(75) Inventor: Kin P. Cheung, Hoboken, NJ (US)

(73) Assignee: Agere Systems Inc., Berkeley Heights, NJ (US)

( * ) Notice: Subject to any disclaimer, the term of this patent is extended or adjusted under 35 U.S.C. 154(b) by 0 days.

(21) Appl. No.: 09/317,430

(22) Filed: May 24, 1999

(51) Int. Cl.$^7$ .............................................. H01L 21/66
(52) U.S. Cl. .............................. 438/17; 438/10; 438/14
(58) Field of Search ............................. 438/14, 17, 10, 438/788, 792; 324/765, 766, 767, 768, 769

(56) References Cited

U.S. PATENT DOCUMENTS

| | | | | | |
|---|---|---|---|---|---|
| 5,679,606 | A | * | 10/1997 | Wang et al. | 438/788 |
| 5,728,259 | A | | 3/1998 | Suzawa et al. | 156/646.1 |
| 5,760,445 | A | | 6/1998 | Diaz | 257/356 |
| 5,908,312 | A | * | 6/1999 | Cheung et al. | 438/287 |
| 5,966,024 | A | * | 10/1999 | Bui et al. | 324/763 |

OTHER PUBLICATIONS

Cheung; "On the use of Fowler–Nordheim stress to reveal plasma–charging damage"; 1996 1$^{st}$ International Symposium on Plasma Process–Induced Damage May 13–14, pp. 11–14.

Hook et al.; "A Comparison of Hot–Electron and Fowler–Nordheim Characterization of Charging Events in a 0.5–$\mu$m COMS Technology"; 1996 1$^{st}$ International Symposium on Plasma Procss–Induced Damage May 13–14, pp. 164–167.

Cham et al.; "Self–Limiting Behavior of Hot Carrier Degradation and its Implication on the Validity of Lifetime Extraction by Accelerated Stress"; 1987 Hewlett Packard Laboratories IEEE/IRPS; pp. 191–194.

Chan et al.; "Parameter Extraction Guidelines for Hot–Electron Reliability Simulation"; 1993 IEEE/IRPS, pp. 32–37.

Cheung; "An Efficient Method for Plasma–Charging Damage Measurement"; 1994 IEEE; pp. 460–462.

Cheung et al.; "Charging Damage for Plasma Enhanced TEOS Deposition"; 1995 IEEE; pp. 220–222.

Misra et al; "Is NMOSFET hot carrier lifetime degraded by charging damage?"; 1997 2$^{nd}$ International Symposium on Plasma Process–Induced Damage May 13–14; pp. 186–188.

McVittie; "Plasma researchers meet, explore process damage"; 1$^{st}$ International Symposium on Plamsa Process–Induced Damage; (Westlaw 3 pages) Oct. 1996.

Doyle et al; "Examination of the Time Power Law Dependencies in Hot Carrier Stressing on n–MOS Transistors"; Feb. 2, 1997; IEEE Electron Device Letters; pp. 51–53.

Hao et al; "Reliability of Submicron MOSFET's With Deposited Gate Oxides Under F–N Injection and Hot–Carrier Stress"; 1992 vol. 265 Material Research Society; pp. 237–242.

Ohr; "Process characterization aids in deep–submicron"; Electronic Engineering Times (Westlaw 3 pages) Jan. 1998.

* cited by examiner

Primary Examiner—Kevin M. Picardat
(74) Attorney, Agent, or Firm—Dickstein Shapiro Morin & Oshinsky LLP

(57) ABSTRACT

The invention relates to the measurement and monitoring of plasma-damage, and to the evaluation of the lifetime of integrated circuits under nominal operating conditions. The method calculates the intrinsic, or damage-free, lifetime of a particular transistor device by measuring the change in transconductance as a function of time for a given device over a short period of time. The change in the transconductance as a function of time, i.e., the slope of the degradation curve, is measured and then compared to a reference value. The present invention thus allows the use of hot-carrier stress method to determine plasma damage in a time efficient manner without the need of applying high acceleration voltages.

39 Claims, 3 Drawing Sheets

USING FAST HOT-CARRIER AGING METHOD FOR MEASURING PLASMA CHARGING DAMAGE

BACKGROUND OF THE INVENTION

1. Field of the Invention

The present invention relates to the fabrication of integrated circuit devices and, in particular, to the measurement, determination and monitoring of plasma damage and latent defects in a semiconductor integrated circuit device.

2. Description of the Related Art

Semiconductor integrated circuits are typically fabricated on a wafer or substrate of a semiconductor material such as, for example, silicon or gallium arsenide. During the fabrication, the wafer may be subjected to a sequence of steps, which may include photomasking, material deposition, oxidation, nitridization, ion implantation, diffusion, and etching, among others. Plasma etching is one preferred method for providing etching anisotropy required for a high degree of pattern definition and precise dimensional control in small device geometries. However, as a result of these numerous exposures of the semiconductor substrates to plasma and ionic radiation during the fabrication processes, the substrates may experience excessive radiation damage and accumulation of charge on floating conductive components, which can result in degradation of the gate dielectric and its interfaces.

Early detection and assessment of the accumulation of plasma charge damage in semiconductor devices is a complex problem. A variety of methods have been proposed and explored to address this problem, but with limited success. Of those, the Fowler-Nordheimn uniform tunneling method and hot-carrier stressing method are among the techniques most frequently used for detecting latent damage resulting from process-induced charging events.

In addition, latent defects created by plasma damage pose important reliability problems for the integrated circuit device. These defects are not readily observable by most of the measurement methods commonly used. The latent defects are either passivated defects formed by temperature cycling after defects are created in the integrated circuit, or the latent defects are simply created by charge detrapping that render the defects invisible to many measurements. A common way to reveal these latent defects is to look for accelerated degradation of device parameters under electrical stress. Common stressing methods for detecting this type of defect include the uniform Fowler-Nordheim method and the channel hot-carrier stress method.

The Fowler-Nordheim stressing method forces current to flow through the gate-oxide under high electric field. To evaluate the latent damage to the wafer using Fowler-Nordheim, the wafer is first annealed to detrap all charges and then currents are injected to repopulate the discharged traps. By measuring the post Fowler-Nordheim stress, transistor threshold voltage (Vt) and transconductance (Gm) shifts caused by plasma damage is assessed by comparing the damaged device to a control device or by detecting antenna ratio dependency in the device.

An additional use of the Fowler-Nordheim stress to measure plasma-damage is to monitor the voltage required for maintaining a constant current injection through a gate oxide. The Initial Electron Trapping Rate (IETR) can be measured from the resultant voltage curve. The IETR is proportional to the electron trap density in the oxide under test. Electron trap density is, in turn, an indicator of plasma damage.

A second type of stress testing method for integrated circuits is the hot-carrier or hot-electron stress method. Although both Fowler-Nordheim and hot-carrier methods detect plasma and latent damage, hot-carrier stress is more sensitive and more adequately quantifies the effect of process-induced events. The hot-carrier stress for n-MOSFET typically place the device at a high drain bias with a gate bias that maximizes the substrate current for a short duration of time. The conditions are set such that a normal, undamaged device is degraded by at least 3 to 5%, as measured on a production tester.

The conventional hot-carrier stress method to determine the lifetime of transistors under nominal operating condition involves aging the device under mildly accelerated conditions for a long period of time. To speed things up, often the aging for each voltage condition is not carried to the point the device degrades beyond the lifetime specification (10% peak linear transconductance (Gm) degradation, for n-channel device, for example). Instead, aging is stopped after a sufficient time and the lifetime for that particular aging condition is obtained through extrapolation. This extrapolation is made possible by the power-law relationship between interface-states generation ($\Delta N_{it}$) (the main degradation mechanism for n-channel devices) and stress time t:

$$\Delta N_{it} = t^n \tag{1}$$

Since interface states affect Gm by reducing the carrier mobility, Gm degradation follows the power-law:

$$\Delta Gm = A t^n \tag{2}$$

where A is a constant.

In other words, a plot of log ($\Delta$Gm/Gm) versus log(t) produces a straight line that can be used for the purpose of extrapolation.

The reason that a stress must be carried out to a long enough time is that there is a saturation effect in the generation rate of interface states. Only after the degradation rate (slope of the curve) of Gm reaches the asymptotic value can one fit the data in the log-log plot to a straight line for lifetime extrapolation. FIG. 1 shows an example of the saturation behavior and the linear extrapolation method for lifetime extraction.

Since plasma-damage is a high-field stressing phenomenon, the most prominent characteristic of degradation is in the increase of fluctuation for most electrical parameters for a device. It is therefore important to measure the degradation of a large enough number of devices to ensure good statistics. This requirement rules out any time consuming methods to be used on a routine basis. Channel hot-carrier stress is therefore normally not a suitable stress method for plasma damage monitoring.

For the purpose of monitoring plasma damage, the absolute hot-carrier lifetime for the devices is not needed. One only need to compare the lifetime under the same accelerated aging condition to see if it is degraded by damage. In principle, the ratio of change in accelerated lifetime due to damage should have a one-to-one relationship to the lifetime change at operating condition.

The prior art overcame the long stress time requirement by using a much higher than normal acceleration voltage to stress the transistors. Hook et al., "A Comparison of Hot-Electron and Fowler-Nordheim Characterization of Charging Events in a 0.5 m CMOS Technology", 164 International Symposium on Plasma Process-Induced Damage, 1996, for example, chose the stress voltage such that in 5 seconds of aging time, 3% to 5% of Gm degradation would occur. As shown in FIG. 1, the 3% to 5% level of degradation is high enough that most of the time the device degradation rate has already reached the asymptotic value. By using such a high level of acceleration, the stress time was cut down to 5 seconds per device, allowing this method to be used with good enough statistics.

In order to further shorten the stress time to speed measurement according to the prior art methods, stress conditions would have to be increased even further. While there is no proof that such a practice will produce erroneous results, the ultra high stress voltage that would be required to speed measurement has been avoided due to the lack of a established voltage acceleration model.

The present invention overcomes the drawbacks of the prior art and provides a method for determining the presence of plasma damage and latent defects while shortening the time for hot-carrier stress and without using an unusually high stress voltage.

SUMMARY OF THE INVENTION

The present invention is a method for shortening the time for hot-carrier stress without using unusually high stress voltage. By using the early part of the degradation curve (($\log \Delta Gm/Gm$)/$\log(t)$), before the slope reaches the asymptotic value, the interface state generation ($N_{it}$) may be expressed in terms of interface state creation efficiency (K). For a given gate-oxide type and quality, interface state creation efficiency (K) is a constant while the channel engineering of the transistor and the channel length determines the time dependent impact ionization rate. As set forth in more detail below, the degradation curve includes two components: an intrinsic component and a damage-induced component. Because the ratio of these two components remains the same throughout the curve, as long as the transistor design remains the same, the damage-induced change of the $\Delta Gm/Gm$ at any part of the degradation curve will have a one-to-one relationship with the extrapolated lifetime change. The change in the transconductance as a function of time, i.e., the slope of the degradation curve, is measured and then compared to a reference value. Thus, the method of the present invention allows the use of hot-carrier stress in a time efficient manner without the need of applying very high acceleration voltages.

The above and other advantages and features of the invention will be more clearly understood from the following detailed description which is provided in connection with the accompanying drawings.

DETAILED DESCRIPTION OF PREFERRED EMBODIMENTS

Figure 1:
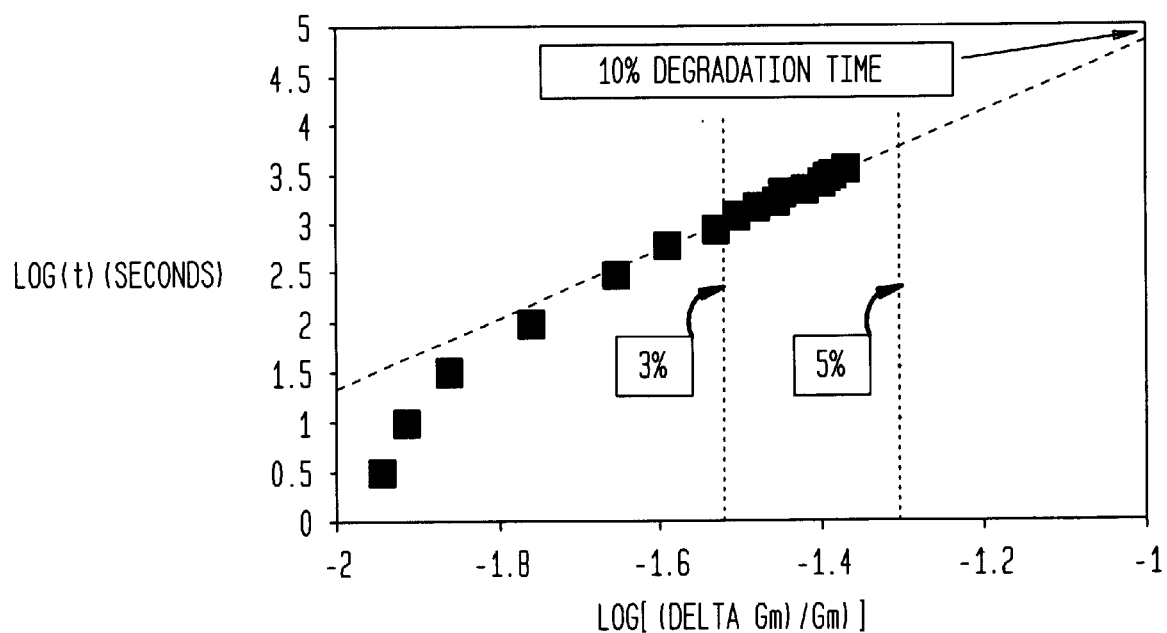
FIG. 1 shows the saturation behavior of the degradation rate due to hot-carrier stressing.

In the following detailed description, reference is made to various specific embodiments in which the invention may be practiced. These embodiments are described with sufficient detail to enable those skilled in the art to practice the invention, and it is to be understood that other embodiments may be employed, and that structural, electrical and methodology changes may be made without departing from the invention. Accordingly, the following detailed description is not to be taken in a limiting sense and the scope of the present invention is defined by the appended claims.

The present invention relates to a method for determining plasma damage in a shortened time using the channel hot-carrier stress method. The present invention further relates to a method for determining plasma damage without using an unusually high stress voltage. The present invention improves over the previous methods by interpreting the early part of the degradation curve (($\log \Delta Gm/Gm$)/$\log(t)$) before the slope reaches the asymptotic value. The slope of the degradation curve is then compared to a reference value to determine whether the device has plasma damage and whether the device will have an adequate lifetime.

The saturation phenomenon in hot-carrier degradation is the consequence of a feedback process. For example, in an n-channel device, as interface states are created at the drain end of the transistor, it is also charged negatively. This negative charge pushes the drain current deeper into the substrate and spreads out the electric field at the drain end. The result is a field reduction that reduces the interface trap creation rate by reducing the impact ionization rate. One can thus express the time dependent rate of interface state generation by the relationship:

$$\frac{d^2 N_{it}}{dt^2} = \kappa \frac{dI_i}{dt} \quad (3)$$

where $I_i$ is the impact ionization rate and K is the interface state creation efficiency by hot carriers, which is independent of time. For a given gate-oxide type and quality, K is fixed while the engineering of the channel in the transistor and the channel length determines the time dependent impact ionization rate.

Plasma-damage degrades the quality of the gate-oxide and thus changes the value of K. The effect of plasma damage on the channel doping profile or the channel length is usually secondary at the most. Thus, the impact of damage on the slope at any point of the degradation curve is the same.

Thus, we arrive at the formula:

$$\frac{d^2 N_{it}}{dt^2} = (\kappa_0 + \kappa_d)\frac{dI_i}{dt} \quad (4)$$

In other words, every part of the degradation curve has two components, the intrinsic part and the damage induced part. The ratio of the two parts should remain the same through out the curve. As long as the transistor design is the same, the damage induced change of the $\Delta Gm/Gm$ at any part of the degradation curve will have a one to one relationship with the extrapolated lifetime change. Thus, the present invention uses the $\Delta Gm/Gm$ change at an early time in the hot-carrier stress method as a way to predict lifetime change due to plasma damage.

The invention is further explained with reference to the following examples. This invention is not intended to be limited by the particular examples described below.

EXAMPLE

Wafers having a gate-oxide with a 90 Å thickness and including n-channel transistors were processed to post metallization anneal (PMA) at 400° C. for thirty minutes after three levels of metal using 0.35 μm CMOS technology. Some wafers were removed from the processing at metal level 1 for damage testing and some of the wafers were removed at metal level 2 processing for damage testing as well as hot-carrier aging after the post metallization anneal. The initial electron trapping slope (ITES) method was used for damage testing which confirmed that plasma damage due to interlevel dielectric deposition exists.

Hot-carrier stress was performed in peak substrate current condition ($V_D$=5.6V, $V_g$=2.3V). Transistor parameters were measured at various points by interrupting the stress. The measurement was performed in a linear regime with the drain bias being set at 200 mV to minimize the impact of drain voltage fluctuation (+/−1 mV). The source and drain were exchanged between stress and measurement to maximize the sensitivity. A typical degradation curve is depicted in FIG. 1.

Figure 2:
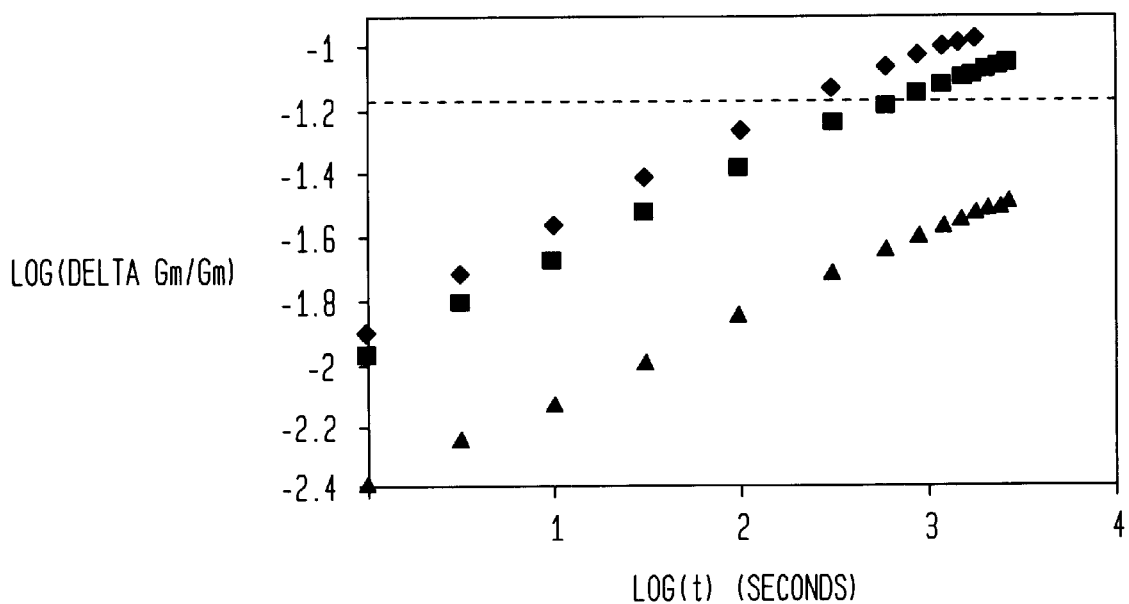
FIG. 2 depicts the degradation curves of three devices having different lifetimes.

The tests were repeated with a large number of devices to eliminate anomalies in the testing process and apparatus and to arrive at a statistically significant conclusion. Since the wafers were from all three groups of wafers, the level of plasma damage covers a wide range. As discussed above, plasma damage is expected to affect the entire degradation curve the same way. Curves from different levels of damage should result in a parallel shift only. Reference is made to FIG. 2, which shows the degradation curves from three samples with differing degrees of plasma damage. As can be seen from the figure, the shift is parallel, which supports the proposition that the ratio remains constant in the linear $\Delta Gm/Gm$ scale for the log product of $(\Delta Gm/Gm)/t$.

Figure 3:
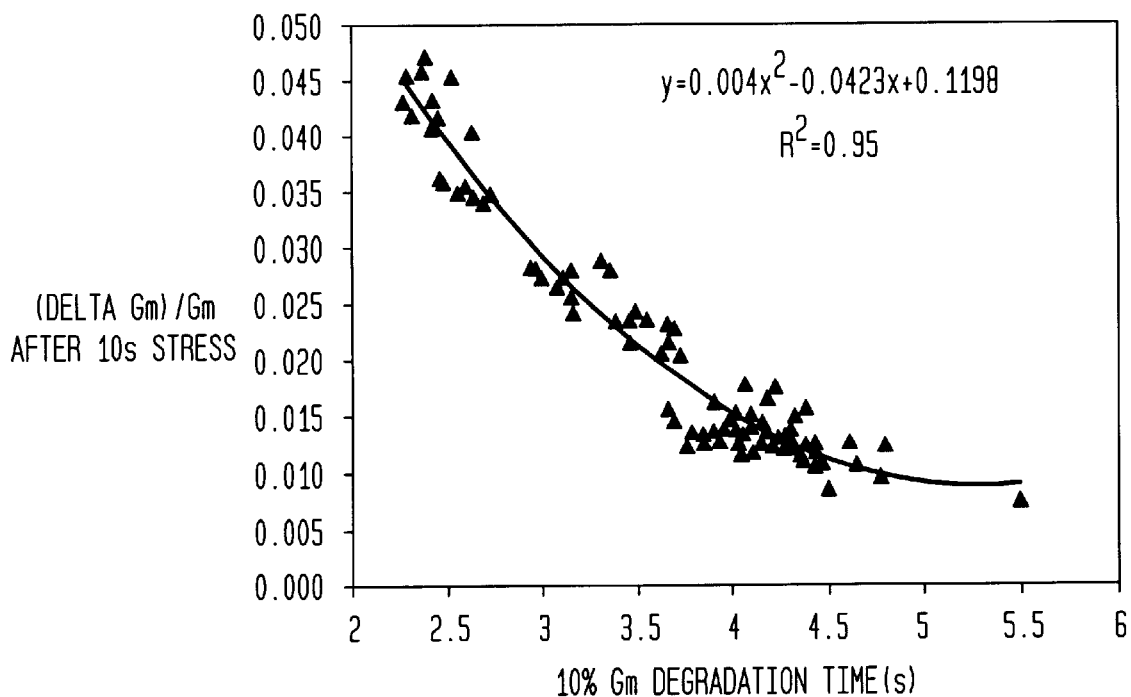
FIG. 3 shows the lifetime (the time needed for 10% degradation) versus the total degradation ($\Delta Gm/Gm$) after 10 seconds of hot-carrier stress.

The lifetime, or the 10% Gm degradation time, of each device may be extracted from the degradation curve by extrapolating the asymptotic part of the curve in view of a known reference life of a like device. The total degradation after each time interval may also be extracted directly from the curve. FIG. 3 is a plot of the total degradation after 10 seconds of stress versus the time needed for 10% degradation (lifetime) under the same stress condition with each data point being extracted from the degradation curve of one device. Although the resulting relationship in the semilog scale is not linear, the relationship is monotonic with the solid curve through the data being a least square fit to a second order polynomial.

Figure 4:
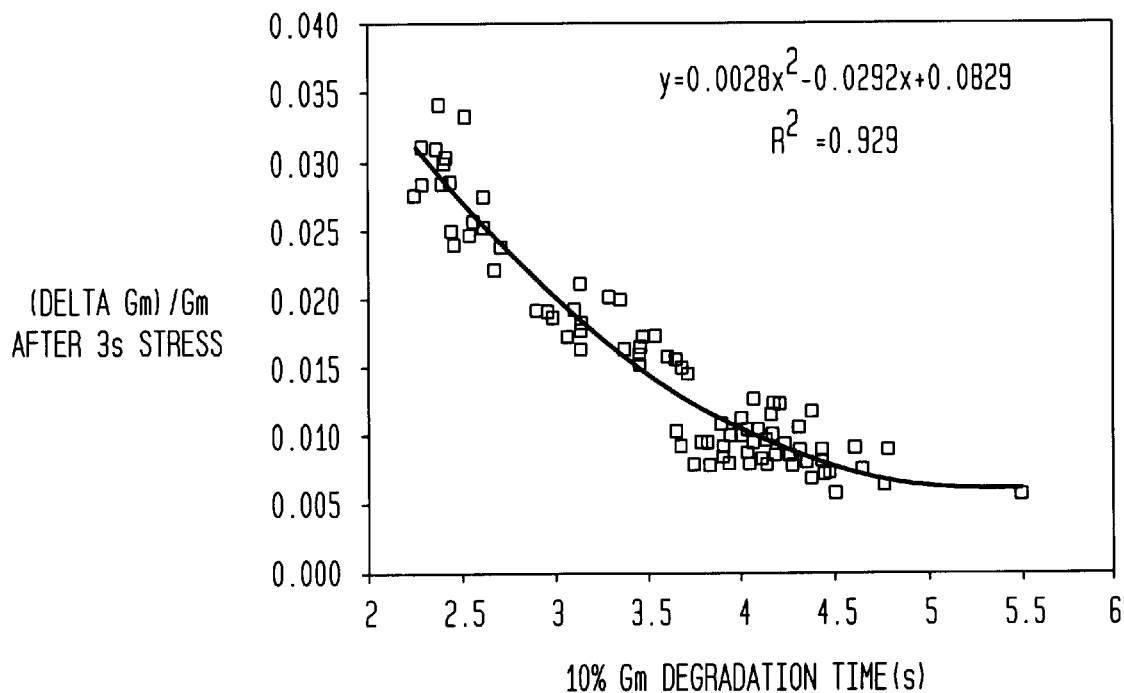
FIG. 4 shows the lifetime versus the total degradation after 3 seconds of hot-carrier stress.
Figure 5:
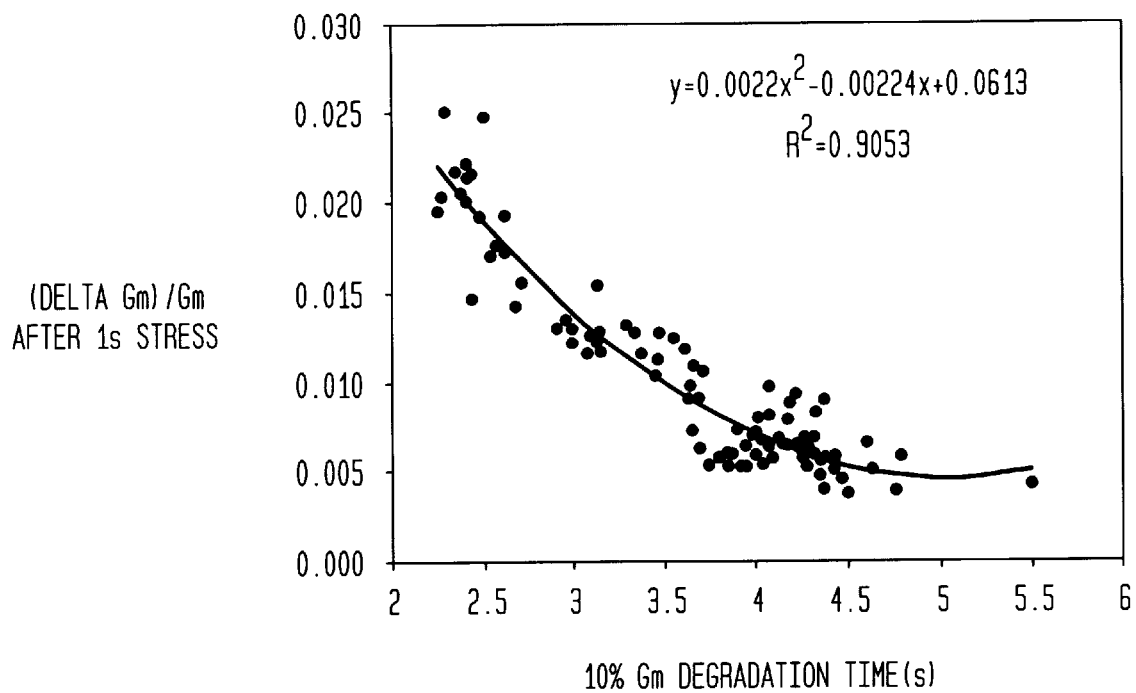
FIG. 5 shows the lifetime versus the total degradation after 1 second of hot-carrier stress.

FIGS. 4 and 5 show the results for 3 seconds and 1 second of total stress, respectively. With the exception of the increases in scattering, due to the inability of the test equipment to hold the drain voltage constant better than 1 mV, these figures are quite similar to the results depicted in FIG. 3.

From the results in FIGS. 3, 4 and 5, the present invention illustrates that to detect hot-carrier lifetime degradation due to plasma-damage, all one needs to do is to stress the sample for a short time, i.e., from about 1 to about 10 seconds, preferably from about 1 to about 3 seconds, most preferably about 1 second. While the relationship to lifetime is not linear, smaller degradation does imply lower damage as well as longer lifetime. The non-linear relationship is not unique to this damage measurement technique.

Figure 6:
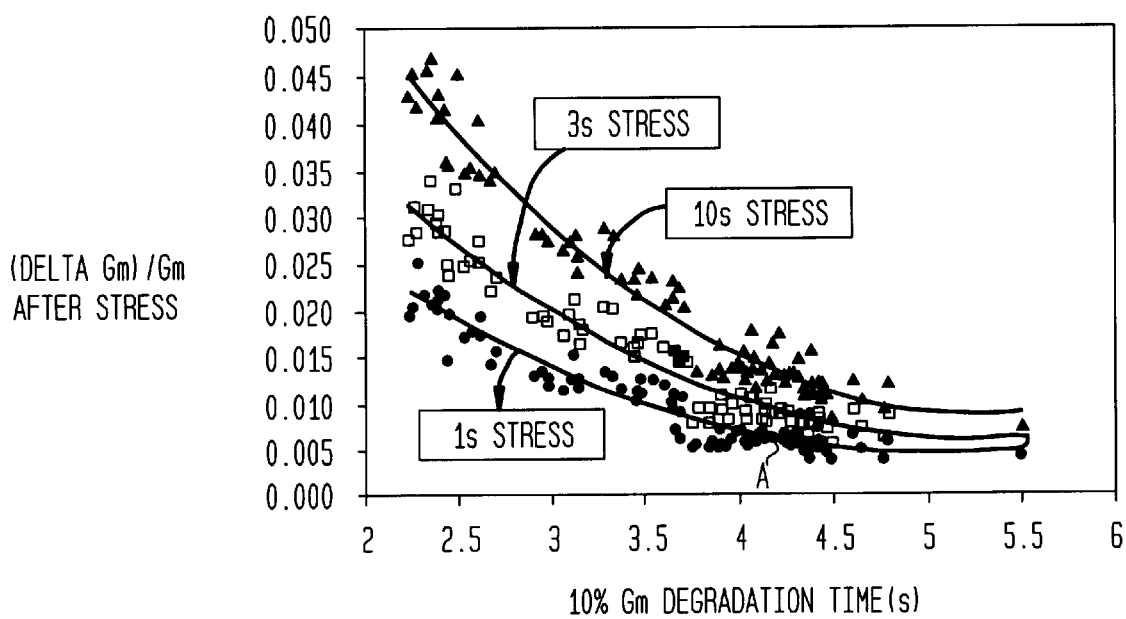
FIG. 6 is a cumulative representation of the lifetime versus the total degradation for all three times, as individually depicted in FIGS. 2–5.

Reference is now made to FIG. 6. By grouping all three sets of data together in one plot, the three curves become parallel to each other for devices indicating low damage. At this range, the intrinsic degradation dominates. One can regard the lifetime value at where the curve level off being the damage-free intrinsic lifetime of the transistors under the stress condition. From this data, it was determined that the best device measured has a lifetime of about 2000 times longer than the worst device measured device. The average measured lifetime for the tested devices (those on wafers pulled at metal 1; the cluster of devices between 4 to 4.5 in the horizontal axis in FIG. 6 and indicated by the reference A) was about 10 years at the operation voltage of 3.3V. FIG. 6 suggests that the damage free lifetime of these devices may be as much as 100 years. Unfortunately, it is difficult to ever achieve a damage free manufacturing process. For the post metal 3 devices in this group (the cluster of devices center around 2.5 in the horizontal axis in FIG. 6), the average lifetime at 3.3V was projected to be only 3 months.

FIG. 6 demonstrates how sensitive n-channel hot-carrier lifetime is to plasma damage. It is therefore highly desirable to use hot-carrier stress to monitor plasma damage. The plasma damage is determined according to the present method by measuring the change in transconductance as a function of time for a given device over a short period of time. The change in the transconductance as a function of time, i.e., the slope of the degradation curve, is measured and then compared to a reference value. Thus, the method of the present invention allows the use of hot-carrier stress in a time efficient manner.

The method according to the present invention may also be used to ascertain process variables. For example, the method according to the present invention may be used to determine whether a new process step, process condition change or new equipment will adversely effect the lifetime of the device. By comparing the resultant degradation curve after the process change to the degradation curve prior to the change, it can be determined whether the process change adversely affects the lifetime of the device through increased plasma or latent damage.

The method reported here, like many plasma damage measurement methods in the literature, is useful for self-referencing. In other words, one can compare the measurement results for a test transistor with transistors that are fundamentally the same, i.e., formed under similar conditions of similar materials and at similar operating conditions, to ascertain whether a like transistor will have a degradation similar to a different from a reference standard for a predetermined device.

The suitability of using a short hot-carrier stress time to monitor plasma damage without the use of a very high acceleration voltage has been demonstrated. When the stress is long enough to extract the lifetime from a large number of devices, i.e., from about 3 to about 20 seconds, the method of the present invention allows the intrinsic (damage free) lifetime of a particular transistor design to be determined. The ability to determine how much the devices are degraded quantitatively without the help of a reference device is unique among plasma-damage measurement methods. It should be understood that while the invention has been described with relation to n-channel devices, the invention has broader applicability and may be used in any integrated circuit devices, or the like. Similarly, the process described above is but one method of many that could be used Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A method for determining the degradation of a semiconductor device, comprising:

stressing said semiconductor device for a predetermined period of time;

measuring the change in transconductance of said semiconductor device for said predetermined period of time; and comparing the change in transconductance of said semiconductor device as a function of time to that of a reference device before the slope of the degradation curve reaches the asymptotic value.

2. The method according to claim 1, wherein said predetermined time is from about 1 to about 10 seconds.

3. The method according to claim 1, wherein said predetermined time is from about 1 to about 3 seconds.

4. The method according to claim 3, wherein said time is about 1 is second.

5. The method according to claim 1, wherein said device is an n-channel device.

6. The method according to claim 1, wherein said method includes determining whether said device has plasma damage.

7. The method according to claim 1, wherein said method includes determining whether said device has latent defects caused by temperature cycling.

8. The method according to claim 1, wherein the change in transconductance as a function of time is measured by calculating the slope of the log of the change in transconductance versus the log of the change in time.

9. The method according to claim 1, wherein the change in transconductance as a function of time for said reference device is determined by calculating the change in transconductance as a function of time for a statistically significant number of devices.

10. The method according to claim 1, wherein said stress is hot-carrier stress.

11. A method for monitoring plasma damage in a semiconductor device fabrication process, comprising:

randomly selecting semiconductor devices from the fabrication process;

stressing said selected semiconductor device for a predetermined period of time;

measuring the change in transconductance of said selected semiconductor device for said predetermined period of time; and comparing the change in transconductance of at least two periods of predetermined time of said selected semiconductor device to that of a reference device.

12. The method according to claim 11, wherein; said predetermined time is from about 1 to about 10 seconds.

13. The method according to claim 11, wherein said predetermined time is from about 1 to about 3 seconds.

14. The method according to claim 13, wherein said time is about 1 second.

15. The method according to claim 11, wherein said device is an n-channel device.

16. The method according to claim 11, wherein said method includes determining whether said device has plasma damage.

17. The method according to claim 11, wherein said method includes determining whether said device has latent defects caused by temperature cycling.

18. The method according to claim 11, wherein said method further includes selecting said semiconductor devices at a plurality of processing stages in said fabrication.

19. The method according to claim 18, wherein said method includes selecting said semiconductor device after a metallization phase and after a post metallization anneal stage.

20. The method according to claim 11, wherein the change in transconductance as a function of time is measured by calculating the slope of the log of the change in transconductance versus the log of the change in time.

21. The method according to claim 11, wherein the change in transconductance as a function of time for said reference device is determined by calculating the change in transconductance as a function of time for a statistically significant number of devices.

22. The method according to claim 11, wherein said stress is hot-carrier stress.

23. A method for determining the plasma damage due to changes in a semiconductor fabrication process, comprising:

determining the plasma damage of a semiconductor device according to a first fabrication process by measuring the change in transconductance over a first period of time for said device;

changing a fabrication parameter of said first fabrication process to arrive at a second semiconductor fabrication process;

stressing a semiconductor device formed in said second semiconductor fabrication process for a predetermined second period of time;

measuring the change in transconductance of said semiconductor device formed in said second semiconductor fabrication process for said predetermined second period of time; comparing the change in transconductance of said semiconductor device formed in said second semiconductor fabrication process as a function of time to that of the semiconductor device according to said first semiconductor fabrication process.

24. The method according to claim 23, wherein said predetermined time is from about 1 to about 10 seconds.

25. The method according to claim 24, wherein said predetermined time is from about 1 to about 3 seconds.

26. The method according to claim 23, wherein said time is about 1 second.

27. The method according to claim 23, wherein the degradation of the semiconductor device according the said first semiconductor fabrication process is determined by the hot-carrier aging method.

28. The method according to claim 23, wherein the degradation of the semiconductor device according the said first semiconductor fabrication process is determined by the Fowler-Nordheim method.

29. The method according to claim 23, wherein said device is an n-channel device.

30. The method according to claim 23, wherein changing a fabrication parameter of said first fabrication process to arrive at a second semiconductor fabrication process includes changing the operation parameters of a plasma etching process to fabricate said semiconductor.

31. The method according to claim 23, wherein changing a fabrication parameter of said first fabrication process to arrive at a second semiconductor fabrication process includes changing the plasma etching device used in the etching process to fabricate said semiconductor.

32. The method according to claim 23, wherein changing a fabrication parameter of said first fabrication process to arrive at a second semiconductor fabrication process includes changing the plasma gas used in a plasma etching process to fabricate said semiconductor.

33. The method according to claim 23, wherein said method further includes measuring the change in transconductance of said semiconductor devices formed by said second fabrication process at a plurality of processing stages in said fabrication.

34. The method according to claim 26, wherein said method includes measuring the change in transconductance of said semiconductor device formed by said second fabrication process after a metallization phase and after a post metallization anneal stage.

35. The method according to claim 23, wherein the change in transconductance as a function of time is measured by calculating the slope of the log of the change in transconductance versus the log of the change in time.

36. The method according to claim 23, wherein the change in transconductance as a function of time for said reference device is determined by calculating the change in transconductance as a function of time for a statistically significant number of devices.

37. The method according to claim 23, wherein said stress is hot-carrier stress.

38. The method according to claim 23, wherein the plasma damage of the semiconductor device according to a first fabrication process is determined by the hot-carrier stress method.

39. The method according to claim 23, wherein the plasma damage of the semiconductor device according to a first fabrication process is determined by the Fowler-Nordheim method.

* * * * *